(12) United States Patent
Ueshima et al.

(10) Patent No.: US 8,975,757 B2
(45) Date of Patent: Mar. 10, 2015

(54) LEAD-FREE SOLDER CONNECTION STRUCTURE AND SOLDER BALL

(75) Inventors: Minoru Ueshima, Matsudo (JP); Masayuki Suzuki, Soka (JP); Yoshie Yamanaka, Tokyo (JP); Shunsaku Yoshikawa, Soka (JP); Tokuro Yamaki, Kobe (JP); Tsukasa Ohnishi, Koshigaya (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 569 days.

(21) Appl. No.: 12/736,053

(22) PCT Filed: Mar. 3, 2009

(86) PCT No.: PCT/JP2009/053949
§ 371 (c)(1),
(2), (4) Date: Jan. 27, 2011

(87) PCT Pub. No.: WO2009/110458
PCT Pub. Date: Sep. 11, 2009

(65) Prior Publication Data
US 2011/0115084 A1     May 19, 2011

(30) Foreign Application Priority Data
Mar. 5, 2008    (JP) .................. 2008-055570

(51) Int. Cl.
*H01L 23/48*     (2006.01)
*H01L 23/52*     (2006.01)
(Continued)

(52) U.S. Cl.
CPC .............. *H01L 24/11* (2013.01); *B23K 35/262* (2013.01); *B23K 35/268* (2013.01); *C22C 13/00* (2013.01);
(Continued)

(58) Field of Classification Search
CPC .......... H01L 2924/01079; H01L 2924/01029; H01L 2924/14
USPC .......... 257/E21.509, E23.023, 738, 772, 780, 257/E23.021, 778; 420/560–562, 557; 438/108, 613, 614
See application file for complete search history.

(56) References Cited

U.S. PATENT DOCUMENTS 6,440,360 B1 *   8/2002   Sawamura et al. ........... 420/560
6,548,891 B2 *   4/2003   Mashino ....................... 257/700
(Continued)

FOREIGN PATENT DOCUMENTS

JP     10144718     5/1998
JP     2000225490    8/2000
(Continued)

OTHER PUBLICATIONS

K. Nogita et al, "Effects of Phosphorus on Microstructure and Fluidity of Sn-0.7Cu-0.05Ni Lead-Free Solder", Materials Transactions, vol. 49, No. 3 (Feb. 25, 2008), pp. 443-448.
(Continued)

*Primary Examiner* — Chris Chu
(74) *Attorney, Agent, or Firm* — Michael Tobias

(57) ABSTRACT

Solder used for flip chip bonding inside a semiconductor package was a Sn—Pb solder such as a Pb-5Sn composition. Lead-free solders which have been studied are hard and easily form intermetallic compounds with Sn, so they were not suitable for a flip chip connection structure inside a semiconductor package, which requires stress relaxation properties. This problem is eliminated by a flip chip connection structure inside a semiconductor package using a lead-free solder which is characterized by consisting essentially of 0.01-0.5 mass percent of Ni and a remainder of Sn. 0.3-0.9 mass percent of Cu and 0.001-0.01 mass percent of P may be added to this solder composition.

20 Claims, 1 Drawing Sheet

(51) Int. Cl.
*H01L 29/40* (2006.01)
*H01L 23/00* (2006.01)
*B23K 35/26* (2006.01)
*C22C 13/00* (2006.01)
*H01L 23/36* (2006.01)
*H01L 21/56* (2006.01)
*H01L 23/31* (2006.01)
*H01L 23/498* (2006.01)

(52) U.S. Cl.
CPC ........... *H01L 21/563* (2013.01); *H01L 23/3114* (2013.01); *H01L 23/3128* (2013.01); *H01L 23/36* (2013.01); *H01L 23/49816* (2013.01); *H01L 24/13* (2013.01); *H01L 24/16* (2013.01); *H01L 24/32* (2013.01); *H01L 24/81* (2013.01); *H01L 2224/11849* (2013.01); *H01L 2224/13111* (2013.01); *H01L 2224/16* (2013.01); *H01L 2224/73253* (2013.01); *H01L 2224/81203* (2013.01); *H01L 2224/81211* (2013.01); *H01L 2224/81801* (2013.01); *H01L 2924/01013* (2013.01); *H01L 2924/01015* (2013.01); *H01L 2924/01029* (2013.01); *H01L 2924/0103* (2013.01); *H01L 2924/01032* (2013.01); *H01L 2924/01033* (2013.01); *H01L 2924/01047* (2013.01); *H01L 2924/01051* (2013.01); *H01L 2924/01078* (2013.01); *H01L 2924/01079* (2013.01); *H01L 2924/01082* (2013.01); *H01L 2924/01322* (2013.01); *H01L 2924/01327* (2013.01); *H01L 2924/09701* (2013.01); *H01L 2924/15311* (2013.01); *H01L 2924/15787* (2013.01); *H01L 2924/15788* (2013.01); *H01L 2924/16195* (2013.01); *H01L 2924/3511* (2013.01); *H01L 2224/0558* (2013.01); *H01L 2224/05644* (2013.01); *H01L 2924/00013* (2013.01); *H01L 2924/01006* (2013.01); *H01L 2924/01023* (2013.01); *H01L 2924/0105* (2013.01); *H01L 2924/01087* (2013.01); *H01L 2924/014* (2013.01); *H01L 2224/8191* (2013.01); *H01L 2924/10253* (2013.01); *H01L 2224/11334* (2013.01)

USPC .................. 257/780; 257/E23.021; 257/738; 257/778; 438/614

(56) References Cited

U.S. PATENT DOCUMENTS

| | | | | |
|---|---|---|---|---|
| 6,689,488 | B2* | 2/2004 | Yoshitome et al. | 428/647 |
| 6,811,892 | B2* | 11/2004 | Yeh et al. | 428/647 |
| 6,908,784 | B1* | 6/2005 | Farnworth et al. | 438/106 |
| 7,029,542 | B2* | 4/2006 | Amagai et al. | 148/400 |
| 7,122,894 | B2* | 10/2006 | Sugimoto et al. | 257/737 |
| 7,132,746 | B2* | 11/2006 | Brandenburg et al. | 257/713 |
| 7,282,175 | B2* | 10/2007 | Amagai et al. | 420/562 |
| 7,338,567 | B2* | 3/2008 | Munekata et al. | 148/400 |
| 7,628,871 | B2* | 12/2009 | Suh | 148/403 |
| 7,879,455 | B2* | 2/2011 | Kajiwara et al. | 428/620 |
| 7,943,861 | B2* | 5/2011 | Iwai et al. | 174/262 |
| 2003/0186072 | A1* | 10/2003 | Soga et al. | 428/620 |
| 2005/0008525 | A1* | 1/2005 | Pfarr et al. | 420/560 |
| 2007/0034305 | A1* | 2/2007 | Suh | 148/561 |

FOREIGN PATENT DOCUMENTS

| | | |
|---|---|---|
| JP | 2001035978 | 2/2001 |
| JP | 2001287082 | 10/2001 |
| JP | 2007141948 | 6/2007 |
| KR | 2004-0063025 | 7/2004 |
| WO | 03098688 | 11/2003 |

OTHER PUBLICATIONS

C. H. Chen et al, "Characterization and Comparison of Five SAC-based Solder Pastes for Pb-free Reflow Soldering", 2007 International Symposium on High Density Packaging and Microsystem Integration, IEEE, PI, Jun. 26-28, 2007, pp. 1-8.

T. Ventura et al, "The Influence of 0-0.1 wt. % Ni on the Microstructure and Fluidity Length of Sn-0.7Cu-xNi", Journal of Electronic Materials, vol. 37, No. 1 (Jan. 2008), pp. 32-39.

K. Nogita et al, Effects of phosphorus on fluidity and microstructure of Sn-0.7Cu-0.5Ni lead-free solder, The Japan Institute of Metals Shuki Koen Taikai, (2007), p. 216.

* cited by examiner

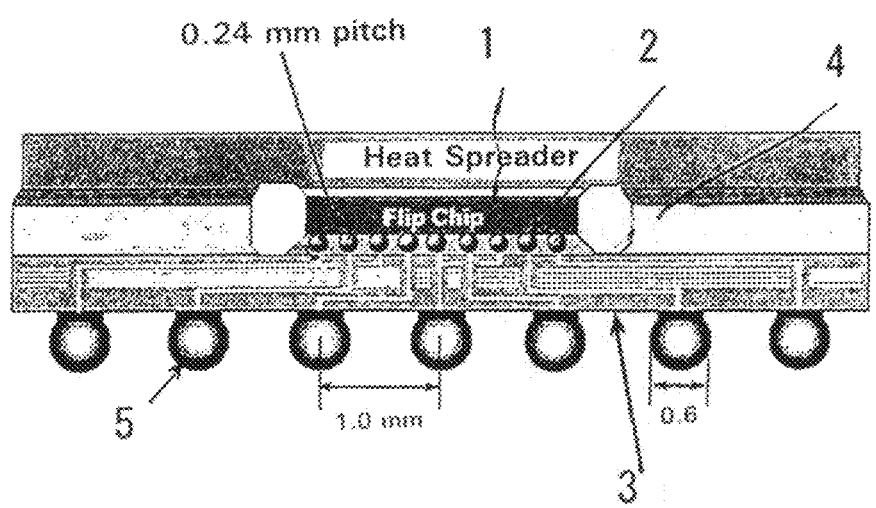

US 8,975,757 B2

LEAD-FREE SOLDER CONNECTION STRUCTURE AND SOLDER BALL

TECHNICAL FIELD

This invention relates to solder for connecting structures having a different coefficient of thermal expansion to each other such as an Si chip and an insulating substrate or for connecting sealed portions of a large structure, a connection structure using this solder, and a solder ball which does not contain lead for use in such a connection structure.

BACKGROUND ART

As electronic equipment becomes smaller in size and thinner, there is a demand for increases in the packaging density of semiconductor packages. For this reason, conventional semiconductor packages have progressed from types such as DIPs, which are mounted by insertion of leads, to surface mounted types such as QFPs which enable high-density packaging. With a semiconductor package having leads such as QFPs, the space of connection between a printed circuit board and the leads of the semiconductor package cannot be effectively utilized. Therefore, in recent years, semiconductor packages of the area array terminal type such as BGAs and CSPs in which the semiconductor package does not have leads and which is directly bonded to a printed circuit board using solder ball electrodes under the package are becoming predominant.

Among semiconductor packages of the area array terminal type such as BGAs and CSPs, taking BGAs as an example, the classes which are prevailing and currently most widely used are PBGAs (Plastic BGAs) in which a semiconductor chip is connected to a plastic substrate by wire bonding using wires such as gold wires and TBGAs (Tape BGAs) in which a polyimide tape is used instead of wires. However, with PBGAs or TBGAs, connections such as wires or a tape are disposed so as to extend to the exterior of a silicon chip. As a result, solder ball electrodes formed on a substrate are gathered on the outer sides of a silicon chip, and solder ball electrodes can not be disposed on the surface of a silicon chip. In order to solve this drawback, FBGAs (Flip Chip BGAs) which can achieve reductions in size and increases in the density of semiconductor packaging have recently come to be used.

In contrast to PBGAs or TBGAs in which wiring is on the upper side of a silicon chip, in FBGAs, solder bumps are provided on electrodes on the underside of a silicon chip, and a semiconductor package is manufactured by performing contact bonding of the solder bumps with a preliminary solder provided on the top face of an insulating substrate. Since FBGAs have no wiring which is extended from the sides of a silicon chip as in a PBGA or TBGA, it is possible to manufacture a semiconductor package which is close to the size of a silicon chip.

In the past, a Sn—Pb based high-temperature solder such as Pb-5Sn has been used as a solder for flip chip bumps formed on the electrodes on the underside of a silicon chip. A Sn—Pb based solder has good elongation properties and excellent heat cycle properties. However, as the effects of lead on the human body become known, the use of lead is becoming a global environmental problem because lead easily dissolves in water. Accordingly, there is a demand for a lead-free solder material and a structure made thereof which can replace Sn—Pb solder, which has excellent properties and particularly resistance to thermal fatigue, which endures without damage to elements, parts, or the like at the time of soldering and at the time of a heat cycle test, and which has excellent solderability.

In order to cope with this problem, a Sn-3Ag-0.5Cu lead-free solder composition which is extensively used for mounting of printed circuit boards has been studied as a lead-free solder for flip chip bumps. Solder bumps used for flip chip bonding of semiconductor packages often have a silicon chip above them and an insulating substrate made of a ceramic such as alumina or a glass epoxy material such as FR-4 below them. Solder alloys have a different coefficient of thermal expansion from a ceramic or a glass-epoxy resin. If a Sn-3Ag-0.5Cu lead-free solder, which is relatively hard and has poor stress relaxation properties compared to a Sn—Pb based solder, is used in such places, peeling easily develops between the flip chip connection structure and the insulating substrate due to heat cycles, leading to problems with respect to reliability.

It has been reported that with a lead-free solder such as Sn-3Ag-0.5Cu solder, so-called Cu erosion occurs more readily than with a conventional Sn—Pb solder. Cu erosion is a phenomenon in which Cu electrodes such as Cu plating formed atop an insulating substrate dissolve in Sn at the time of reflow soldering, and it results in peeling easily taking place between the chip connection structure and the insulating substrate. Cu erosion takes place more easily as the melting temperature of solder increases. Technologies which have been disclosed for solving this problem include a semiconductor assembly which uses a low-temperature lead-free solder such as Sn—In, Sn—Bi, Sn—Zn, or Sn—Zn—Bi (JP 2007-141948 A, Patent Document 1) and a connection structure which uses a low-temperature lead-free solder composition in the form of a Sn—Ag—Cu—In—Bi solder composition (JP 2001-35978 A, Patent Document 2).

Patent Document 1: JP 2007-141948 A
Patent Document 2: JP 2001-35978 A

DISCLOSURE OF INVENTION

Problem which the Invention is to Solve

The problem which the invention is to solve is to provide a solder connection structure and a lead-free solder ball for flip chip packaging which have stress relaxation properties close to those of a conventional Sn—Pb solder and which do not readily cause Cu erosion of Cu electrodes on an insulating substrate even though made from a solder alloy which does not contain lead which pollutes the environment.

The solder alloys disclosed in Patent Document 1 have a eutectic temperature of 117° C. for Sn—In, a eutectic temperature of 139° C. for Sn—Bi, and a eutectic temperature of 199° C. for Sn—Zn. Sn—In and Sn—Bi alloys are characterized by having a lower melting temperature than a conventional Sn—Pb solder, which has a eutectic temperature of 183° C. A Sn—3Ag—0.5Cu solder (melting temperature of approximately 220° C.) is often used as a solder alloy for mounting semiconductor packages. Therefore, if Sn—In or Sn—Bi is used as a solder for flip chip packaging, the flip chip solder inside the resulting semiconductor package will melt during mounting of the semiconductor package. The soldered joints in a semiconductor package are typically reinforced by an underfill of an epoxy resin or similar material after flip chip bonding. Therefore, even if the flip chip solder becomes half-molten, it is inconceivable for the solder to immediately flow out and cause defective connections. However, when a semiconductor package is mounted using a Sn-3Ag-0.5Cu solder, reflow soldering is typically carried out with a peak temperature of 235-240° C. If a Sn—In or Sn—Bi solder composition is used inside a semiconductor package, since the melting temperature of the solder is low, it completely melts, and even if strength reinforcement is carried out with an underfill, it is conceivable that the molten solder will destroy the underfill and defective connections will result. In addition, a Sn—Bi solder composition is harder and more brittle than a Sn-3Ag-0.5Cu solder composition. When a Sn—Bi solder is used to form flip chip bumps which have little margin for stress relaxation, breakage easily takes place inside the solder, and the reliability of semiconductor packages becomes inferior.

Sn—Zn based compositions such as Sn—Zn and Sn—Zn—Bi are characterized in that Zn forms a thick oxide film so that the solder has poor wettability. Therefore, it is necessary to use a strong flux when a solder having a Sn—Zn based composition is used. After bumps are formed by flip chip bonding, it is necessary that the flux be cleaned out before an underfill material is injected. However, since the interior of a flip chip package has a fine structure, it is not possible to remove 100% of the flux by cleaning. Therefore, the use of a solder alloy having a Sn—Zn based composition, which requires a flux, as a solder for flip chip bonding inside a semiconductor package decreases the reliability of the semiconductor package.

The solder alloy disclosed in Patent Document 2 is also an invention which was developed in order to lower the melting temperature of a conventional Sn—Sb solder by employing a low-temperature Sn—Ag—Cu—In—Bi solder composition. Patent Document 2 discloses a solder structure having a two-layer structure with a conventional Sn—Sb solder in a lower layer and a low-temperature Sn—Ag—Cu—In—Bi solder in an upper layer. In Patent Document 2, the Sn—Sb solder in the lower layer has poor wettability, and it contains Sb which is hard, so the Sn—Sb solder cannot be expected to provide stress relaxation. The low temperature Sn—Ag—Cu—In—Bi solder in the upper layer has a lower melting temperature compared to a Sn-3Ag-0.5Cu solder used for mounting semiconductor packages on printed circuit boards. In addition, since it contains hard Bi, stress relaxation cannot be anticipated from a Sn—Ag—Cu—In—Bi solder. Therefore, the technology disclosed in this document cannot be applied to flip chip bonding.

Means for Solving the Problem

The present inventors discovered that a Sn—Ni based solder alloy in which a minute amount of Ni is added to Sn is suitable as a solder for flip chip bonding inside a semiconductor package, as a result of which they completed the present invention.

Sn is a metal having a melting temperature of 232° C. A Sn-3Ag-0.5Cu lead-free solder which is typically used for soldering of semiconductor packages to printed circuit boards has a lower melting temperature of 220° C. However, elemental Sn itself has low reliability with respect to heat cycles as well as poor wettability, so it is not suitable as a solder for flip chip bonding inside a semiconductor package. Surprisingly, the addition of a minute amount of Ni to Sn increases the reliability with respect to heat cycles or the like and also improves wettability.

In a semiconductor package of the area array terminal type such as a BGA or CSP having a silicon chip on a substrate, the surface of the silicon chip has Al-plated electrodes which are further treated by Ni plating and then Au plating, while the substrate is an insulating substrate which may be either a ceramic substrate such as an alumina substrate or a glass epoxy substrate such as an FR-4 substrate and has Cu-plated lands or Cu foil lands formed on the substrate. With most semiconductor packages, the Cu-plated or Cu foil lands are treated by Ni plating and then Au plating. Au plating formed atop Ni plating is intended to increase wettability by molten solder. Since Au plating rapidly diffuses into molten solder, the formation of a solder bond actually takes place between solder and Ni.

Soldering is a kind of brazing in which connection is achieved by forming an intermetallic compound between molten solder and the metal to be connected. During soldering for flip chip bonding inside a semiconductor package, soldering takes place with Ni plating. Therefore, when using a conventional Pb-5Sn solder, since Pb does not form an intermetallic compound to a significant extent, Sn and Ni form a $Ni_3Sn_4$ intermetallic compound in the bonding interface. Similarly, in the case of a lead-free solder, intermetallic compounds of Ni with Sn or other metal or metals in the lead-free solder are formed in the bonding interface. If a semiconductor package having a silicon chip soldered on an insulating substrate is exposed to heat cycles, because the silicon chip and the insulating substrate have different coefficients of thermal expansion from solder, cracks easily develop in the most brittle portions as expansion and contraction are repeated. In the case of flip chip bumps inside a semiconductor package, as the intermetallic compounds formed in the bonding interface between the silicon chip and the solder and between the insulating substrate and the solder are the hardest and most brittle portions, the largest number of cracks develop in the solder bonding interface.

Lead-free solder has Sn as the main element, to which Ag, Cu, In, Bi, Zn, or other elements are added. Accordingly, in the case of flip chip bumps inside a semiconductor package, the predominant intermetallic compound formed in the bonding interface between a silicon chip and solder and between an insulating substrate and solder is $Ni_3Sn_4$. If the $Ni_3Sn_4$ forms a thick layer, since it is hard and brittle, stress relaxation does not take place, and fatigue failure in the form of cracks and the like develops. By adding a minute amount of Ni to Sn as a solder for flip chip bonding inside a semiconductor package, the formation of a $Ni_3Sn_4$ intermetallic compound in the bonding interface between a silicon chip and solder and between an insulating substrate and solder is suppressed, and the intermetallic compound layer is made thin, resulting in an improvement in heat cycle properties. In this manner, a solder connection structure having a high strength can be obtained by using a Sn—Ni solder for flip chip bonding inside a semiconductor package.

A suitable amount of Ni which is added to Sn is 0.01-0.5 mass percent. If the Ni content is less than 0.01 mass percent, the effect of suppressing the formation of intermetallic compounds is not obtained, while if the Ni content is larger than 0.5 mass percent, the Sn—Ni solder alloy itself becomes hard, so the effect of stress relaxation of solder is not obtained, and cracks end up developing in the solder portion itself.

As the amount of Ni added to Sn increases, the liquidus temperature of the solder increases, and it becomes necessary to increase the soldering temperature when the flip chip solder bumps are bonded to an insulating substrate inside a semiconductor package. Increasing the soldering temperature promotes the formation of intermetallic compounds and increases the thickness of an intermetallic compound layer. In addition, some insulating substrates have Cu lands which are not covered by plating. If a Sn—Ni solder containing 0.5 mass percent or more of Ni is used on such an insulating substrate, due to the high soldering temperature, Cu erosion in which Cu of the lands is eroded develops, and cracks easily develop in the bonding interfaces between the Cu lands and solder when heat cycles are applied. The amount of Ni added to Sn is preferably 0.02-0.05 mass percent. If Ni is added to Sn in an amount of at least 0.02 mass percent, the effect of suppressing the formation of a $Ni_3Sn_4$ intermetallic compound develops more apparently, while if Ni is added to Sn in an amount of at most 0.05 mass percent, the stress relaxation properties of the solder alloy itself are improved and the liquidus temperature thereof is such that the solder can be used at the same soldering temperature as a reflow temperature of Sn.

Furthermore, by adding a minute amount of Cu to a Sn—Ni based solder alloy in which a minute amount of Ni is added to Sn and which is used as solder for flip chip bonding inside a semiconductor package, it is possible to obtain a connection structure having even higher bonding strength and better stress relaxation properties. Cu is a relatively flexible metal as is evidenced by the fact that a Cu plate can be easily bent. A suitable minute amount of Cu which is added to solder is 0.3-0.9 mass percent. If the Cu content in a Sn—Ni solder is less than 0.3 mass percent, an increase in strength is not obtained, while if it is added in excess of 0.9 mass percent, the liquidus temperature of the solder increases and the soldering temperature becomes high, resulting in an increase in intermetallic compounds which are formed during soldering and causing Cu erosion to occur. A Sn—Ni solder to which 0.3-0.9 mass percent of Cu is added preferably has a composition of 0.02-0.05 mass percent of Ni and a remainder of Sn. A more preferable composition is 0.3-0.7 mass percent of Cu, 0.02-0.04 mass percent of Ni, and a remainder of Sn.

An even stronger solder connection structure can be obtained by adding 0.001-0.01 mass percent of P to a Sn—Ni or Sn—Ni—Cu composition which are used as a solder for flip chip bonding inside a semiconductor package. Adding P to a Sn—Ni solder or a Sn—Ni—Cu solder increases wettability and makes it possible to carry out solder bonding in a short length of time, whereby the formation of intermetallic compounds is suppressed and the strength of the solder connection structure is increased. If the amount of P added to a Sn—Ni solder or a Sn—Ni—Cu solder is less than 0.001 mass percent, the effect of improving wettability is not obtained, while if it is more than 0.01 mass percent, the solder liquidus temperature increases and the soldering temperature becomes high, which results in an increase in the formation of intermetallic compounds and the occurrence of Cu erosion. A more preferred added amount of P is 0.002-0.005 mass percent. With this content of P, the solder can be used at a soldering temperature which is the same as the reflow temperature of Sn.

The addition of Ge, which like P is used as an oxidation-suppressing element for Sn-3Ag-0.5Cu lead-free solder which is generally used for mounting, cannot be expected to provide the same effect as P. The addition of even a small amount of Ge to a Sn—Ni solder or a Sn—Ni—Cu solder causes the liquidus temperature to increase, which causes the soldering temperature to increase and brings about an increase in the formation of intermetallic compounds and the occurrence of Cu erosion.

Effects of the Invention

A flip chip connection structure of a lead-free solder according to the present invention suppresses the formation of a $Ni_3Sn_4$ intermetallic compound in the bonding interface between a silicon chip and solder and between an insulating substrate and solder. As a result, a flip chip connection structure of high reliability which has good resistance to heat cycles and excellent stress relaxation properties can be obtained. Furthermore, as it has a melting temperature which is around 10° C. higher than that of a Sn-3Ag-0.5Cu lead-free solder which is generally used for mounting, when a semiconductor package is mounted on a printed circuit board, the solder inside the package can become merely a half-molten state, and it is possible that an underfill serves to adequately suppress the solder from melting down. As the melting temperature of the solder is not too high, the soldering temperature does not increase to such an extent that brings about an increase in the formation of intermetallic compounds or the occurrence of Cu erosion.

BRIEF EXPLANATION OF THE DRAWINGS

FIG. 1 is a schematic diagram of a FBGA (flip chip packaging of a semiconductor).

LIST OF REFERENCE NUMBERS 1 silicon chip
2 fine solder balls for flip chip bonding
3 insulating substrate (FR-4)
4 stiffener
5 solder balls forming external terminals

BEST MODE FOR CARRYING OUT THE INVENTION

A solder alloy for use in a lead-free solder flip chip connection structure according to the present invention is used to form solder bumps on electrodes of a silicon chip by printing in the form of a solder paste or by supplying in the form of solder balls. Solder balls are spherical particles of solder. They must be completely spherical, since at the time of placing on a wafer or a substrate, solder balls undergo the steps of being rolled atop a pallet and being inserted into holes in the pallet for alignment. In addition, as solder balls which are placed on a wafer or a substrate are checked by image recognition, the surface of the solder balls must not be damaged or discolored.

In the case of a flip chip connection structure with a large chip size, solder is typically supplied in the form of a solder paste. In the case of a flip chip connection structure having a small chip size such as a CSP, the electrodes are also small, and a sufficient bump height for flip chip bonding cannot be achieved with a solder paste. Therefore, the use of a solder paste is not suitable for flip chip bonding with a small chip size. In contrast, supplying solder in the form of solder balls has the advantages that the stand-off height can be made uniform due to the uniform height of solder balls and that tall bumps can be readily formed. Therefore, it is suitable that the solder for use in flip chip bonding to form internal electrode structures inside a package be supplied in the form of solder balls. The use of solder balls is suitable when the electrodes of a silicon chip have a diameter of at most 0.3 mm, and more preferably when the electrodes have a diameter of at most 0.1 mm. In this case, the solder used for flip chip bonding to form internal electrode structures is suitably in the form of solder balls having a diameter of at most 0.3 mm and preferably at most 0.1 mm.

Accordingly, from a second aspect, the present invention is a solder ball for flip chip bonding characterized in that the solder ball has a particle diameter of at most 0.3 mm and a lead-free solder composition consisting essentially of 0.01-0.5 mass percent of Ni and a remainder of Sn.

Example 1

A lead-free solder flip chip connection structure according to the present invention will be explained with respect to the manufacturing process for a FBGA (flip chip BGA).

1. A water-soluble flux is printed on the entire surface of a silicon chip measuring 12 mm×12 mm×0.2 mm. The silicon chip has Al electrodes with a diameter of 80 micrometers and a pitch of 150 micrometers on which are formed an Ni undercoat plating which is covered with an Au plating.
2. Solder balls are heaped atop a metal mask for disposing solder balls, brushed off the mask with a polyurethane squeegee, and then disposed only atop the locations of the electrodes on the square silicon chip which has been coated with flux.
3. Reflow soldering is carried out with preheating at 150° C. for 30 seconds and main heating with a peak temperature of 260° C. for 10 seconds. After soldering, flux residue is washed off using deionized water at 40° C., and the silicon chip is dried, resulting in the formation of flip chip solder bumps on the silicon chip.
4. A water-soluble flux is printed using a metal mask on a glass epoxy substrate (FR-4) measuring 20 mm×50 mm×1.0 mm. The substrate has electrodes coated with an undercoat of Ni plating which is coated with Au plating.
5. The silicon chip on which solder bumps for flip chip bonding were formed is placed atop the glass epoxy substrate which was coated with flux, the electrodes of both members are aligned using a flip chip bonder, and the flip chip solder bumps and the glass epoxy substrate are temporarily secured to each other by thermocompression bonding.
6. Reflow soldering is carried out with preheating at 150° C. for 30 seconds and main heating with a peak temperature of 260° C. for 10 seconds. After soldering, flux residue is washed off with deionized water at 40° C. in a flip chip washer, and a lead-free solder flip chip connection structure according to the present invention is completed after drying.

Subsequent steps of the FBGA process include:

7. An epoxy underfill adhesive is used to fill the inside of the flip chip connection structure and is cured.
8. A lid made of Kovar or the like is laid on the substrate as a cap for a semiconductor package, and the lid is sealed to the substrate using a Sn—Au solder or the like. Solder bumps are formed using solder balls on the outer electrodes of the glass epoxy substrate. After this step is completed, the product can be sold as a semiconductor package.

The solder balls used for external electrodes of the semiconductor package in the just-mentioned step are solder balls having a much larger size (around 0.25-0.76 mm) than the solder balls used for flip chip bonding used in the present invention.

Example 2

The solder balls used for external electrodes and the solder balls used for inner bumps are different not only with respect to size but also with respect to the properties demanded thereof. For example, because solder balls used for external electrodes have external forces directly applied thereto, shear strength and the like are considered important.

In contrast, solder balls used for inner bumps are sandwiched between a silicon wafer and a substrate, and external forces are not directly applied thereto. Therefore, the strength properties of the solder alloy such as bulk strength and shear strength are not considered important. Rather, the stress relaxation properties of the solder alloy itself are important. The stress relaxation properties of solder alloys can be compared by comparing the amount of warping after reflow heating.

A lead-free solder flip chip connection structure was prepared by the same process as in Example 1 using each of the solder compositions shown in Table 1. Its melting temperature and the amount of warping of the silicon chip after reflow heating were measured.

Measurement of the liquidus temperature was performed using a differential scanning calorimeter (DSC). The results are shown in Table 1.

The lead-free solder flip chip connection structures was subjected to reflow heating at a reflow temperature of 30° C. above the liquidus temperature, and warping of the silicon chips after reflow heating was measured. The amount of warping was determined by measuring the height of the center of a mounted Si chip and the height of the four corners of the chip and calculating the amount of warping. Warping of at most 200 micrometers is preferable and at most 150 micrometers is more preferable. The results are shown in Table 1.

Next, a Cu plate having electrolytic Ni plating with a thickness of 0.5 micrometers was dipped for 180 seconds in a molten solder bath at 280° C. of the lead-free solder to be tested, then a cross section of the Cu plate was observed with a SEM for a total length of 30-40 mm along the interface of the Ni plating to determine whether the Ni plating was missing. If even a portion of the Ni plating disappeared so as to cause Cu to directly react with Sn in the solder, the solder was evaluated as unacceptable (X), while if the Ni plating remained over the entire length with no direct reaction between Cu and Sn, the solder was evaluated as satisfactory (0) in terms of Ni erosion. The experimental results are shown in Table 1.

TABLE 1

| | | Lead-free solder composition (%) | | | | | Liquidus temp. | Chip warping (μm) | Ni erosion |
|---|---|---|---|---|---|---|---|---|---|
| | | Sn | Ni | Cu | P | Other | | | |
| Examples | 1 | rem. | 0.02 | | | | 232 | 120 | ○ |
| | 2 | rem. | 0.05 | | | | 232 | 110 | ○ |
| | 3 | rem. | 0.5 | | | | 238 | 180 | ○ |
| | 4 | rem. | 0.01 | 0.9 | | | 232 | 170 | ○ |
| | 5 | rem. | 0.05 | 0.3 | | | 227 | 140 | ○ |
| | 6 | rem. | 0.04 | 0.3 | | | 227 | 120 | ○ |
| | 7 | rem. | 0.02 | 0.5 | | | 233 | 150 | ○ |
| | 8 | rem. | 0.04 | 0.7 | | | 227 | 130 | ○ |
| | 9 | rem. | 0.05 | 0.7 | 0.001 | | 245 | 190 | ○ |
| | 10 | rem. | 0.02 | 0.5 | 0.01 | | 230 | 150 | ○ |

TABLE 1-continued

|   |   | Lead-free solder composition (%) | | | | Liquidus temp. | Chip warping (μm) | Ni erosion |
|---|---|---|---|---|---|---|---|---|
|   |   | Sn | Ni | Cu | P | Other | | |
| Comparative | 1 | 100% | | | | | 232 | 80 | X |
|  | 2 | rem. | 0.02 | 0.2 | | | 226 | 120 | X |
|  | 3 | rem. | 0.01 | 1.2 | | | 255 | 250 | ○ |
|  | 4 | rem. | 0.05 | 0.7 | | Ge 0.01 | 246 | 220 | ○ |
|  | 5 | rem. | 1 | | | | 290 | 320 | ○ |
|  | 6 | rem. | | | | Bi 10 | 223 | 350 | X |
|  | 7 | rem. | | | | Sb 5 | 242 | 300 | X |

The amount of warping of a silicon chip after reflow heating indirectly indicates stress relaxation of a lead-free solder flip chip connection structure sandwiched between a silicon chip and an insulating substrate. With a solder composition which does not produce stress relaxation in a lead-free solder flip chip connection structure, a large amount of strain due to warping of the silicon chip develops in the connection structure. If such a strain due to warping of the silicon chip develops, cracks easily develop in the deformed portion of the lead-free solder flip chip connection structure, thereby greatly decreasing the reliability of the connection structure.

As can be seen from the results in Table 1, a lead-free solder flip chip connection structure according to the present invention had a low liquidus temperature of the solder, a small strain due to warping of the silicon chip, and good properties with respect to Ni erosion. Therefore, the connection structure is thought to exhibit adequate reliability. In contrast, it can be seen that the comparative examples of a lead-free solder flip chip connection structure had a high liquidus temperature and a high level of strain due to warping of the silicon chip, so their reliability was inadequate.

Industrial Applicability

A lead-free solder flip chip connection structure according to the present invention can be used not only for flip chip soldering inside a semiconductor package but can also be used for soldering of locations where stress relaxation is essential due to a sandwich construction (confined from both sides) such as bumps for flip chip bonding between a flexible substrate and a semiconductor chip.

The invention claimed is:

1. A solder ball which has a diameter of at most 0.1 mm and is made from a lead-free solder consisting of 0.01-0.05 mass percent of Ni, 0.3-0.9 mass percent of Cu, 0.001-0.01 mass percent of P, and a remainder of Sn, the solder having a liquidus temperature of at most 245° C.

2. A solder ball arrangement comprising a plurality of solder balls as claimed in claim 1 disposed on electrodes of a silicon chip.

3. A method of forming a flip chip connection structure comprising disposing a plurality of lead-free solder balls as claimed in claim 1 on electrodes of a silicon chip, heating the solder balls to form them into solder bumps bonded to the electrodes of the silicon chip, placing the silicon chip atop an insulating substrate with the solder bumps aligned with electrodes of the insulating substrate, and heating the solder bumps to bond them to the electrodes of the insulating substrate.

4. A solder ball as claimed in claim 1 wherein the solder contains 0.002-0.005 mass percent of P.

5. A lead-free solder flip chip connection structure for an interior of a semiconductor package comprising a plurality of inner solder bumps sandwiched between and bonded to an Ni-plated electrode of a silicon chip and an Ni-plated electrode on a top surface of an insulating substrate and made of a lead-free solder selected from (a) a solder consisting of 0.01-0.05 mass percent of Ni and a remainder of Sn and having a liquidus temperature of at most 245° C., (b) a solder consisting of 0.01-0.05 mass percent of Ni, 0.3-0.9 mass percent of Cu, and a remainder of Sn and having a liquidus temperature of at most 245° C., and (c) a solder consisting of 0.01-0.05 mass percent of Ni, 0.3-0.9 mass percent of Cu, 0.001-0.01 mass percent of P, and a remainder of Sn and having a liquidus temperature of at most 245° C., the solder bumps being made from solder balls having a diameter of at most 0.1 mm.

6. A lead-free solder flip chip connection structure as claimed in claim 5 wherein the lead-free solder contains 0.3-0.9 mass percent of Cu.

7. A lead-free solder flip chip connection structure as claimed in claim 5 wherein the lead-free solder consists of 0.01-0.05 mass percent of Ni and a remainder of Sn.

8. A lead-free solder flip chip connection structure as claimed in claim 5 wherein the insulating substrate has external electrodes formed on a bottom surface of the insulating substrate for connection to an external member.

9. A lead-free solder flip chip connection structure as claimed in claim 5 wherein the solder consists of 0.01-0.05 mass percent of Ni, 0.3-0.9 mass percent of Cu, and a remainder of Sn.

10. A lead-free solder flip chip connection structure as claimed in claim 5 wherein the solder consists of 0.01-0.05 mass percent of Ni, 0.3-0.9 mass percent of Cu, 0.001-0.01 mass percent of P, and a remainder of Sn.

11. A lead-free solder flip chip connection structure as claimed in claim 5 wherein the solder consists of 0.02-0.04 mass percent of Ni, 0.3-0.7 mass percent of Cu, and a remainder of Sn.

12. A lead-free solder flip chip connection structure as claimed in 5 wherein the solder contains 0.002-0.005 mass percent of P.

13. A solder ball arrangement comprising a plurality of solder balls which have a diameter of at most 0.1 mm and are disposed on electrodes of a silicon chip and are each made of a lead-free solder selected from (a) a solder consisting of 0.01-0.05 mass percent of Ni and a remainder of Sn and having a liquidus temperature of at most 245° C., (b) a solder consisting of 0.01-0.05 mass percent of Ni, 0.3-0.9 mass percent of Cu, and a remainder of Sn and having a liquidus temperature of at most 245° C., and (c) a solder consisting of 0.01-0.05 mass percent of Ni, 0.3-0.9 mass percent of Cu, 0.001-0.01 mass percent of P, and a remainder of Sn and having a liquidus temperature of at most 245° C.

14. A solder ball arrangement as claimed in claim 13 wherein the electrodes are Ni-plated electrodes.

15. A solder ball arrangement as claimed in claim 13 wherein the lead-free solder contains 0.02-0.05 mass percent of Ni.

16. A solder ball arrangement as claimed in claim 13 wherein the solder consists of 0.01-0.05 mass percent of Ni and a remainder of Sn.

17. A solder ball arrangement as claimed in claim 13 wherein the solder consists of 0.01-0.05 mass percent of Ni, 0.3-0.9 mass percent of Cu, and a remainder of Sn.

18. A solder ball arrangement as claimed in claim 13 wherein the solder consists of 0.01-0.05 mass percent of Ni, 0.3-0.9 mass percent of Cu, 0.001-0.01 mass percent of P, and a remainder of Sn.

19. A solder ball arrangement as claimed in claim 13 wherein the solder consists of 0.02-0.04 mass percent of Ni, 0.3-0.7 mass percent of Cu, and a remainder of Sn.

20. A solder ball arrangement as claimed in 13 wherein the solder contains 0.002-0.005 mass percent of P.

\* \* \* \* \*